US011232998B2

(12) United States Patent
Jhong et al.

(10) Patent No.: US 11,232,998 B2
(45) Date of Patent: Jan. 25, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Fong Jhong, Kaohsiung (TW); Chen-Chao Wang, Kaohsiung (TW); Hung-Chun Kuo, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 4 days.

(21) Appl. No.: 16/732,054

(22) Filed: Dec. 31, 2019

(65) Prior Publication Data

US 2021/0202353 A1 Jul. 1, 2021

(51) Int. Cl.

| | |
|---|---|
| ***H01L 23/48*** | (2006.01) |
| ***H01L 21/768*** | (2006.01) |
| ***H01L 23/522*** | (2006.01) |
| ***H01L 21/48*** | (2006.01) |
| ***H01L 23/528*** | (2006.01) |
| ***H01L 23/498*** | (2006.01) |

(52) U.S. Cl.

CPC ........ *H01L 23/481* (2013.01); *H01L 21/4814* (2013.01); *H01L 21/76804* (2013.01); *H01L 21/76843* (2013.01); *H01L 23/5226* (2013.01); *H01L 23/5283* (2013.01)

(58) Field of Classification Search

CPC ........... H01L 21/4814; H01L 21/76804; H01L 21/76843; H01L 23/481; H01L 23/5226; H01L 23/5283

See application file for complete search history.

(56) References Cited

U.S. PATENT DOCUMENTS

2007/0216019 A1* 9/2007 Hsu .................. H01L 23/49827 257/700
2009/0145636 A1* 6/2009 Miki .................. H01L 23/315 174/255
2011/0296681 A1* 12/2011 Niki .................. H05K 3/4682 29/852
2016/0381781 A1* 12/2016 Park .................. H05K 3/4644 174/252
2019/0380212 A1* 12/2019 Chien .................. H05K 3/4038

* cited by examiner

*Primary Examiner* — Herve-Louis Y Assouman
(74) *Attorney, Agent, or Firm* — Foley & Lardner LLP

(57) ABSTRACT

A semiconductor device package includes a substrate, a first circuit layer and a second circuit layer. The first circuit layer is disposed on the substrate. The first circuit layer has a plurality of dielectric layers and a first through via penetrating the dielectric layers and electrically connected to the substrate. The second circuit layer is disposed on the first circuit layer. The second circuit layer has a plurality of dielectric layers and a second through via penetrating the dielectric layers and electrically connected to the first circuit layer.

22 Claims, 13 Drawing Sheets

SEMICONDUCTOR DEVICE PACKAGE AND METHOD OF MANUFACTURING THE SAME

BACKGROUND

1. Field of the Disclosure

The present disclosure relates to a semiconductor device package and a method of manufacturing the same, and to a semiconductor device package having an interconnection structure and a method of manufacturing the same.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase. Thus, thickness of the semiconductor substrate may correspondingly increase, and yield of the semiconductor substrate may decrease.

SUMMARY

In some embodiments, a semiconductor device package includes a substrate, a first circuit layer and a second circuit layer. The first circuit layer is disposed on the substrate. The first circuit layer has a plurality of dielectric layers and a first through via penetrating the dielectric layers and electrically connected to the substrate. The second circuit layer is disposed on the first circuit layer. The second circuit layer has a plurality of dielectric layers and a second through via penetrating the dielectric layers and electrically connected to the first circuit layer.

In some embodiments, a semiconductor device package includes a lower-density substrate and a first higher-density substrate. The first higher-density substrate is disposed on the lower-density substrate. The first higher-density substrate has a plurality of dielectric layers and a plurality of interconnection layers at least partially covered by the dielectric layers. The first higher-density substrate includes a first through via penetrating the dielectric layers and electrically connecting the first higher-density substrate with the lower-density substrate. A ratio of a width of the first through via to a height of the first through via is equal to or less than 1:2.

In some embodiments, a method of manufacturing a semiconductor device package includes (a) providing a substrate; (b) connecting a first circuit layer to the substrate through a first adhesive layer, the first circuit layer having a plurality of dielectric layers; and (c) forming a first through via penetrating the dielectric layers of the first circuit layer and the first adhesive layer to be electrically connected to the substrate. A width of the first through via to a height of the first through via is less than 1:2.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
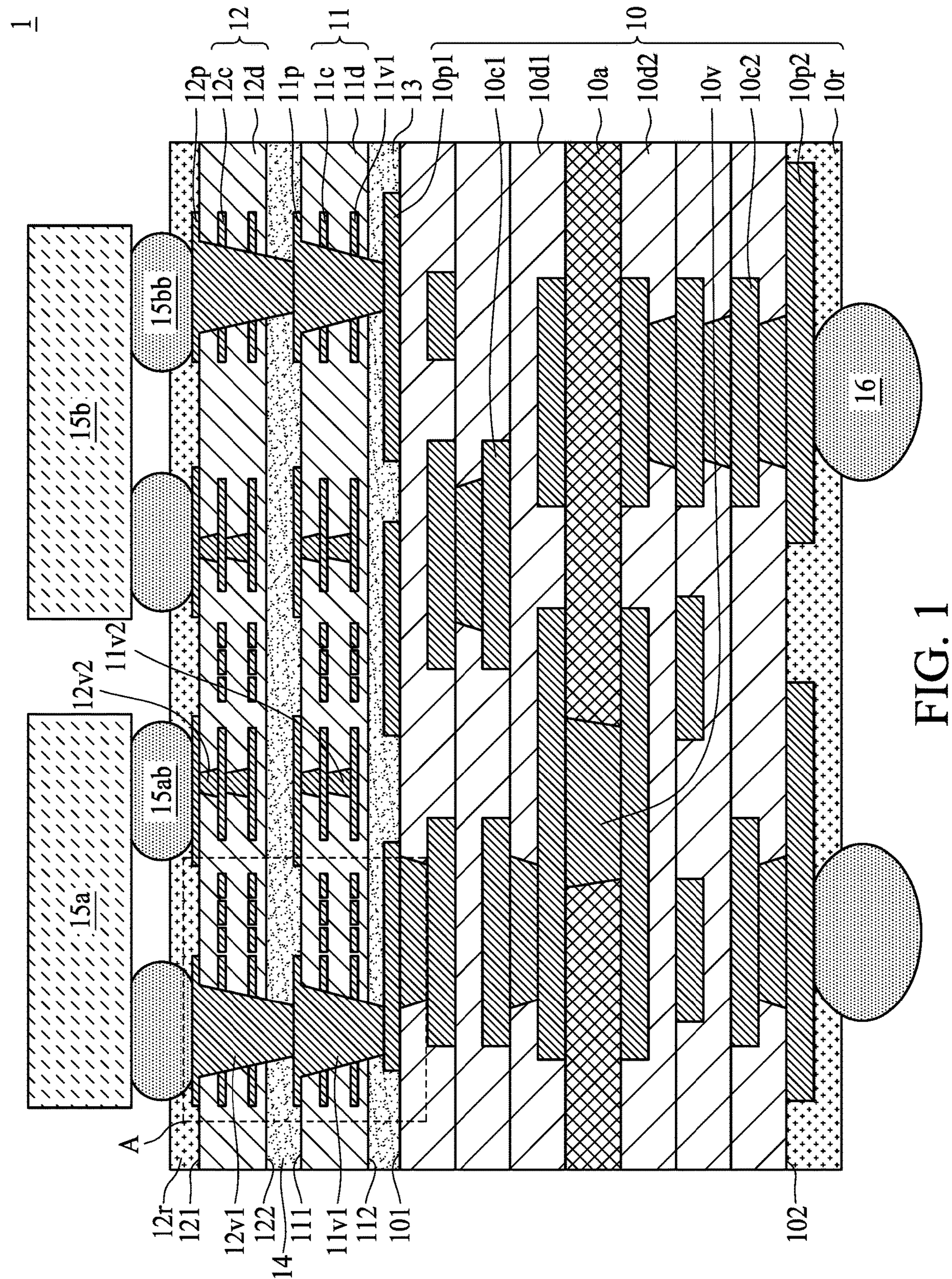
FIG. 1 illustrates a cross-sectional view of a semiconductor device package in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, the number of the dielectric layer of a substrate should increase. In some embodiments, a manufacturing process of a core substrate may include the following steps. Firstly, a core with two copper foils disposed on two sides thereof is provided. Then, a plurality of dielectric layers and a plurality of circuit layers are formed or stacked on the two copper foils. One circuit layer may be embedded in one dielectric layer. Therefore, the core substrate may include a plurality of stacked dielectric layers and a plurality of circuit layers embedded in the dielectric layers on both sides of the core. Since a line width/line space (L/S) of the circuit layer of such core substrate may be greater than or equal to 10 micrometers (μm)/10 μm, the number of the dielectric layer of such core substrate should be relatively large. Although the manufacturing cost of such core substrate is low, the manufacturing yield for the circuit layers and the dielectric layers of such core substrate is also low, thus, the yield of such core substrate is low. In addition, the dielectric layer is relatively thicker, thus, such core substrate is relatively thicker. In a comparative embodiment, if a package has 10000 I/O counts, such core substrate may include twelve layers of circuit layer and dielectric layer. The manufacturing yield for one layer (including one circuit layer and one dielectric layer) of such core substrate may be 90%. Thus, the yield of such core substrate may be $(0.9)^{12}$=28.24%.

To address above concerns, in some embodiments, a coreless substrate is provided. The coreless substrate may include a plurality of dielectric layers and a plurality of fan-out circuit layers. In some embodiments, a manufacturing process of a coreless substrate may include the following steps. Firstly, a carrier is provided. Then, a plurality of dielectric layers and a plurality of fan-out circuit layers are formed or stacked on a surface of the carrier. One fan-out circuit layer may be embedded in one dielectric layer. Then, the carrier is removed. Therefore, the coreless substrate may only include a plurality of stacked dielectric layers and a plurality of fan-out circuit layers embedded in the dielectric layers. Since a line width/line space (L/S) of the fan-out circuit layer of such coreless substrate may be less than or equal to 2 μm/2 μm, the number of the dielectric layer of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a semiconductor device package which has an acceptable compromise of yield and manufacturing cost. In some embodiments, the semiconductor device package includes an upper conductive structure and a lower conductive structure bonded to the upper conductive structure through an adhesion layer. At least some embodiments of the present disclosure further provide for techniques for manufacturing the semiconductor device package.

FIG. 1 illustrates a cross-sectional view of a semiconductor device package 1 according to some embodiments of the present disclosure. The semiconductor device package 1 includes a substrate, circuit layers 11, 12, adhesive layers 13, 14, electronic components 15*a*, 15*b* and electrical contacts 16.

The substrate 10 has a surface 101 and a surface 102 opposite to the surface 101. The substrate 10 may be, for example, a printed circuit board, such as a paper-based copper foil laminate, a composite copper foil laminate, or a polymer-impregnated glass-fiber-based copper foil laminate. In some embodiments, the substrate 10 may be a multi-layer substrate which includes a core layer and a conductive material and/or structure. For example, the substrate 10 includes a core portion 10*a*, and may be in a wafer type, a panel type or a strip type. The substrate 10 includes at least one dielectric layer (including, for example, the dielectric layers 10*d*1 and 10*d*2) and at least one conductive layer (including, for example, the conductive layers 10*c*1 and 10*c*2) in contact with the dielectric layer. The dielectric layer and the conductive layer are disposed on the surfaces 101 and 102 of the substrate 10. The substrate 10 has one or more conductive vias 10*v* penetrating the core portion 10*a* and electrically connecting the conductive layer disposed on the surface 101 of the substrate 10 with the conductive layer disposed on the surface 102 of the substrate 10. In other embodiments, the substrate 10 may be a single-layer substrate or a coreless substrate depending on different design specifications.

The substrate 10 may include one or more conductive pads 10*p*1, 10*p*2 in proximity to, adjacent to, or embedded in and exposed at both surfaces (e.g., the surfaces 101 and 102) of the substrate 10. The substrate 10 may include a solder resist (or solder mask) 10*r* on the surface 102 of the substrate 10 to fully expose or to expose at least a portion of the conductive pads 10*p*2 for electrical connections. The electrical contacts 16 are disposed on the surface 102 of the substrate 10 and electrically connected to the conductive pads 10*p*2 exposed from the solder resist 10*r* to provide electrical connections between the semiconductor device package 1 and external components (e.g. external circuits or circuit boards). The electrical contacts 16 (e.g. solder balls) may include a controlled collapse chip connection (C4) bump, a ball grid array (BGA) or a land grid array (LGA).

The circuit layer 11 is disposed on the surface 101 of the substrate 10. In some embodiments, the circuit layer 11 is connected or attached to the surface 101 of the substrate 10 through the adhesive layer 13 or a connection layer (e.g., tape, glue or die attach film (DAF)). The circuit layer 11 includes one or more interconnection layers (e.g., redistribution layer, RDL) 11*c* and one or more dielectric layers 11*d*. The interconnection layers 11*c* at different layers or levels may be electrically connected to each other through conductive vias 11*v*2. A portion of the interconnection layers 11*c* is covered or encapsulated by the corresponding dielectric layers 11*d* while another portion of the interconnection layers 11*c* is exposed from the corresponding dielectric layer 11*d* to provide electrical connections. In some embodiments, the circuit layer 11 may include any number of interconnection layers and dielectric layers depending on different design specifications. The pitch of the interconnection layers 11*c* of the circuit layer 11 is less the pitch of the conductive layers 10*c*1, 10*c*2 of the substrate 10. For example, the circuit layer 11 can provide fine-pitch connections. For example, the circuit layer 11 has higher-density interconnection structures, and the substrate 10 has lower-density interconnection structures. In some embodiments, a line/space (L/S) of the conductive layers 10*c*1 and 10*c*2 of the substrate 10 is equal to or greater than 20/20 μm, and the interconnection layers 11*c* of the circuit layer 11 is equal to or less than 20/20 μm. For, example, the L/S of the interconnection layers 11*c* of the circuit layer 11 is equal to or less than 10/10 μm. For, example, the L/S of the interconnection layers 11*c* of the circuit layer 11 is equal to or less than 5/5 μm. For, example, the L/S of the interconnection layers 11*c* of the circuit layer 11 is equal to or less than 2/2 μm.

In some embodiments, the dielectric layers 11*d* may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layers 11*d* may include an inorganic material, such as silicon, a ceramic or the like. The interconnection layers 11*c* may include, for example, gold (Au), silver (Ag), copper (Cu), nickel (Ni), palladium (Pd), another metal, a solder alloy, or a combination of two or more thereof.

In some embodiments, the circuit layer 11 has a through via 11v1 penetrating the dielectric layers 11d of the circuit layer 11 (e.g., extending between surfaces 111 and 112 of the circuit layer 11) and the adhesive layer 13 to electrically connect the circuit layer 11 with the substrate 10. For example, the through via 11v1 is electrically connected to the conductive pads 10p1 disposed on the surface 101 of the substrate 10. In some embodiments, an aspect ratio of the through via 11v1 (e.g., a ratio of the width of a bottom surface of the through via 11v1 to the height/depth of the through via 11v1) is less than 1:5. For example, the aspect ratio of the through via 11v1 is in a range from 1:1 to 1:2. Thus, the through via 11v1 would have a better electrical performance (e.g., less resistance, less insertion loss or the like). In addition, the process for manufacturing the through via 11v1 is more stable compared with through vias having relatively higher aspect ratio. For example, the voids would not be generated during the manufacturing process (e.g., the plating process).

The circuit layer 12 is disposed on the surface 111 of the circuit layer 11. In some embodiments, the circuit layer 12 is connected or attached to the surface 111 of the circuit layer 11 through the adhesive layer 14 or a connection layer (e.g., tape, glue or DAF). The circuit layer 12 includes one or more interconnection layers (e.g., RDL) 12c and one or more dielectric layers 12d. The interconnection layers 12c at different layers or levels may be electrically connected to each other through conductive vias 12v2. A portion of the interconnection layers 12c is covered or encapsulated by the corresponding dielectric layers 12d while another portion of the interconnection layers 12c is exposed from the corresponding dielectric layer 12d to provide electrical connections. In some embodiments, the circuit layer 12 may include any number of interconnection layers and dielectric layers depending on different design specifications. The pitch of the interconnection layers 12c of the circuit layer 12 is less the pitch of the conductive layers 10c1, 10c2 of the substrate 10. For example, the circuit layer 12 can provide fine-pitch connections. For example, the circuit layer 12 has higher-density interconnection structures, and the substrate 10 has lower-density interconnection structures. In some embodiments, the dielectric layers 12d and the interconnection layer 12c may include the same or different materials from the materials of the dielectric layer 11d and the interconnection 11c depending on different design specifications.

In some embodiments, the circuit layer 12 has a through via 12v1 penetrating the dielectric layers 12d of the circuit layer 12 (e.g., extending between surfaces 121 and 122 of the circuit layer 12) and the adhesive layer 14 to electrically connect the circuit layer 12 with the circuit layer 11. For example, the through via 12v1 is electrically connected to the conductive pads 11p disposed on the surface 111 of the circuit layer. For example, the through via 12v1 is electrically connected to the through via 11v1. In some embodiments, an aspect ratio of the through via 12v1 is less than 1:5. For example, the aspect ratio of the through via 12v1 is in a range from 1:1 to 1:2.

Figure 2:
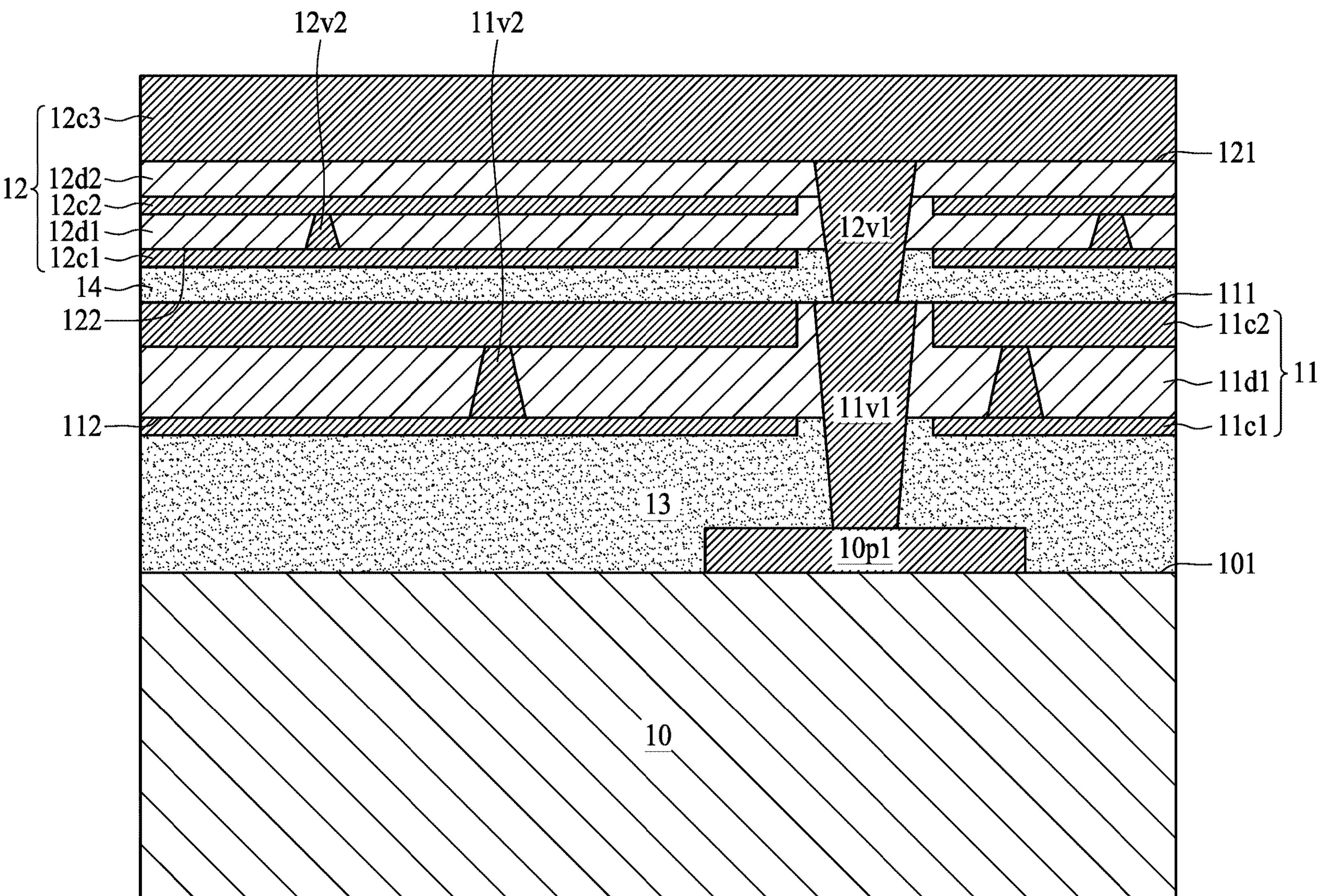
FIG. 2 illustrates an enlarged view of a portion of the semiconductor device package illustrated in FIG. 1 in accordance with some embodiments of the present disclosure.

Referring to FIG. 2, which illustrates an enlarged view of a portion (e.g., the portion encircled by a dotted-line square A) of the semiconductor device package 1 in FIG. 1 in accordance with some embodiments of the present disclosure, the circuit layer 11 has interconnection layers 11c1, 11c2, conductive vias 11v2 and a dielectric layer 11d1 covering the interconnection layer 11c2 and the conductive vias 11v2. In some embodiments, the interconnection layer 11c1 is disposed on the surface 112 of the circuit layer 11. In some embodiments, the interconnection layer 11c1 is covered by the adhesive layer 13. In other embodiments, the interconnection layer 11c1 may be exposed from the adhesive layer 13. The conductive via 11v2 is electrically connected between the interconnection layers 11c1 and 11c2. In some embodiments, the conductive via 11v2 tapers from the interconnection layer 11c1 toward the interconnection layer 11c2. For example, a width of a surface of the conductive via 11v2 adjacent to the interconnection layer 11c1 is greater than a width of a surface of the conductive via 11v2 adjacent to the interconnection layer 11c2.

The through via 11v1 penetrates the dielectric layer 11d1 and the adhesive layer 13 to be electrically connected to the conductive pad 10p1 disposed on the surface 101 of the substrate 10. The through via 11v1 may provide an electrical connection between the circuit layer 11 and the substrate 10. In other words, the electrical connection between the interconnection layers (e.g., 11c1 and 11c2) within the circuit layer 11 may be achieved by the conductive via 11v2 while the electrical connection between the circuit layer 11 and the substrate 10 may be achieved by the through via 11v1. In some embodiments, the through via 11v1 may be electrically connected to one or more interconnection layers of the circuit layer 11.

In some embodiments, the through via 11v1 tapers from the adhesive layer 14 toward the adhesive layer 13. For example, a width of a surface of the through via 11v1 adjacent to the adhesive layer 14 is greater than a width of a surface of the through via 11v1 adjacent to the adhesive layer 13. In some embodiments, the surface of the through via 11v1 adjacent to the adhesive layer 14 is substantially coplanar with a surface of the adhesive layer 14 facing the adhesive layer 13.

In some embodiments, the interconnection layers 11c1 and 11c2 may have the same thickness. In some embodiments, the interconnection layers 11c1 and 11c2 may have different thicknesses. For example, as shown in FIG. 2, the thickness of the interconnection layer 11c2 is greater than the thickness of the interconnection layer 11c1. In some embodiments, the thickness of the interconnection layer 11c1 is in a range from about 1 μm to about 5 μm. In some embodiments, the thickness of the interconnection layer 11c2 is in a range from about 8 μm to about 15 μm. In some embodiments, the relatively thinner interconnection layer (e.g., the interconnection layer 11c1) may be configured to transmit signal or data with the relatively lower data rate (e.g., power, ground, command or other signal (baseband signal) that would not be significantly affected by the impedance of the transmission line). In some embodiments, the relatively thicker interconnection layer (e.g., the interconnection layer 11c2) may be configured to transmit signal or data with the relatively higher data rate (e.g., signal or data from Serializer/Deserializer (SerDes) or any other high speed data/signal (e.g., the signal that would be significantly affected by the impedance of the transmission line).

The circuit layer 12 has interconnection layers 12c1, 12c2, 12c3, conductive vias 12v2 and dielectric layers 12d1, 12d2 covering the interconnection layers 12c2, 13c3 and the conductive vias 12v2. In some embodiments, the interconnection layer 12c1 is disposed on the surface 122 of the circuit layer 12. In some embodiments, the interconnection layer 12c1 is covered by the adhesive layer 14. In other embodiments, the interconnection layer 12c1 may be exposed from the adhesive layer 14. The conductive via 12v2 is electrically connected between the interconnection layers 11_c_1 and 11_c_2 or between the interconnection layers 11_c_2 and 11_c_3. In some embodiments, the conductive via 12_v_2 tapers from the interconnection layer 12_c_1 toward the interconnection layer 12_c_2. For example, a width of a surface of the conductive via 12_v_2 adjacent to the interconnection layer 12_c_1 is greater than a width of a surface of the conductive via 12_v_2 adjacent to the interconnection layer 12_c_2.

The through via 12_v_1 penetrates the dielectric layers 12_d_1, 12_d_2 and the adhesive layer 14 to be electrically connected to the through via 11_v_1. In some embodiments, a width of a bottom surface of the through via 12_v_1 is less than a width of a top surface of the through via 11_v_1. In some embodiments, the through via 12_v_1 is in contact with the through via 11_v_1. Alternatively, there is a seed layer disposed between the through via 11_v_1 and the through via 12_v_1. In some embodiments, the through via 12_v_1 is substantially aligned with the through via 11_v_1 in a direction perpendicular to the surface 111 of the circuit layer 11. The through via 12_v_1 may provide an electrical connection between the circuit layer 11 and the circuit layer 12. In other words, the electrical connection between the interconnection layers (e.g., 12_c_1, 12_c_2 and 12_c_3) within the circuit layer 12 may be achieved by the conductive via 12_v_2 while the electrical connection between the circuit layer 11 and the circuit layer 12 may be achieved by the through via 12_v_1. In some embodiments, the through via 12_v_1 may be electrically connected to one or more interconnection layers of the circuit layer 12.

In some embodiments, the through via 12_v_1 tapers from the interconnection layer 12_c_3 toward the adhesive layer 14. For example, a width of a surface of the through via 12_v_1 adjacent to the interconnection layer 12_c_3 is greater than a width of a surface of the through via 12_v_1 adjacent to the adhesive layer 14. In some embodiments, an interface of the through vias 12_v_1 and 11_v_1 is substantially coplanar with a surface of the adhesive layer 14 facing the adhesive layer 13. Similar to the circuit layer 11, the interconnection layers 12_c_1, 12_c_2 and 12_c_3 may have the same or different thickness depending on different design specifications.

Figure 3:
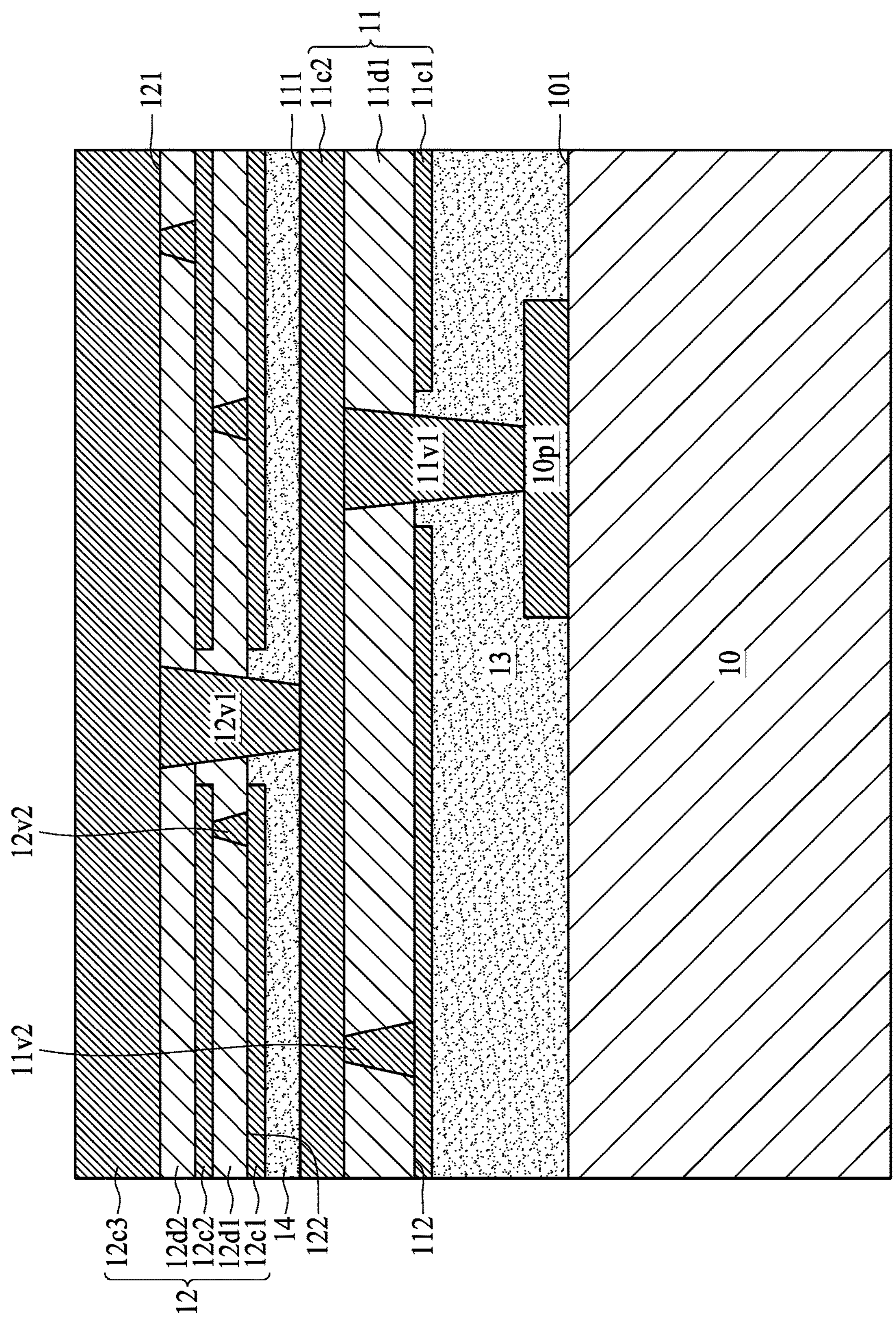
FIG. 3 illustrates an enlarged view of a portion of the semiconductor device package illustrated in FIG. 1 in accordance with some embodiments of the present disclosure.

FIG. 3 illustrates an enlarged view of a portion (e.g., the portion encircled by a dotted-line square A) of the semiconductor device package 1 in FIG. 1 in accordance with some embodiments of the present disclosure. The structure illustrated in FIG. 3 is similar to the structure illustrated in FIG. 2, and the difference therebetween are described below. In some embodiments, as shown in FIG. 3, the through via 12_v_1 does not directly contact the through via 11_v_1. The through via 12_v_1 is electrically connected to the through via 11_v_1 through the interconnection layer 11_c_2. The through via 12_v_1 is misaligned with the through via 11_v_1 in a direction perpendicular to the surface 111 of the circuit layer 11.

Figure 4:
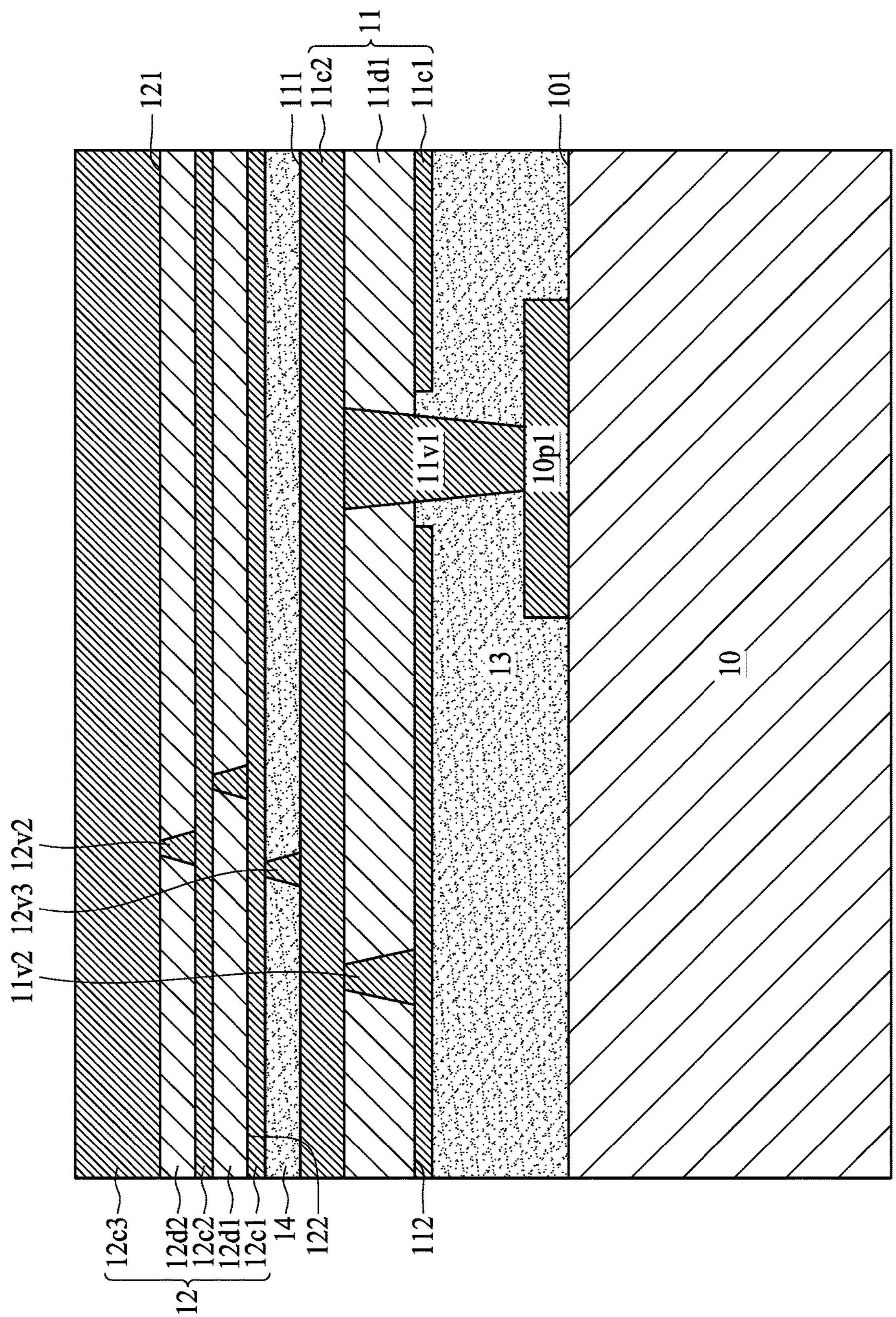
FIG. 4 illustrates an enlarged view of a portion of the semiconductor device package illustrated in FIG. 1 in accordance with some embodiments of the present disclosure.

FIG. 4 illustrates an enlarged view of a portion (e.g., the portion encircled by a dotted-line square A) of the semiconductor device package 1 in FIG. 1 in accordance with some embodiments of the present disclosure. The structure illustrated in FIG. 4 is similar to the structure illustrated in FIG. 2, and the difference therebetween are described below. In some embodiments, the through via 12_v_1 is omitted. The electrical connection between the circuit layer 12 and the circuit layer 11 may be achieved by the conductive vias 12_v_2 and 12_v_3. For example, one of the conductive vias 12_v_2 provide electrical connection between the interconnection layers 12_c_3 and 12_c_2, another conductive via 12_v_2 provide electrical connection between the interconnection layers 12_c_2 and 12_c_1, and the conductive via 12_v_3 penetrating the adhesive layer 14 to electrically connect the interconnection layer 12_c_1 with the interconnection layer 11_c_2.

Figure 5:
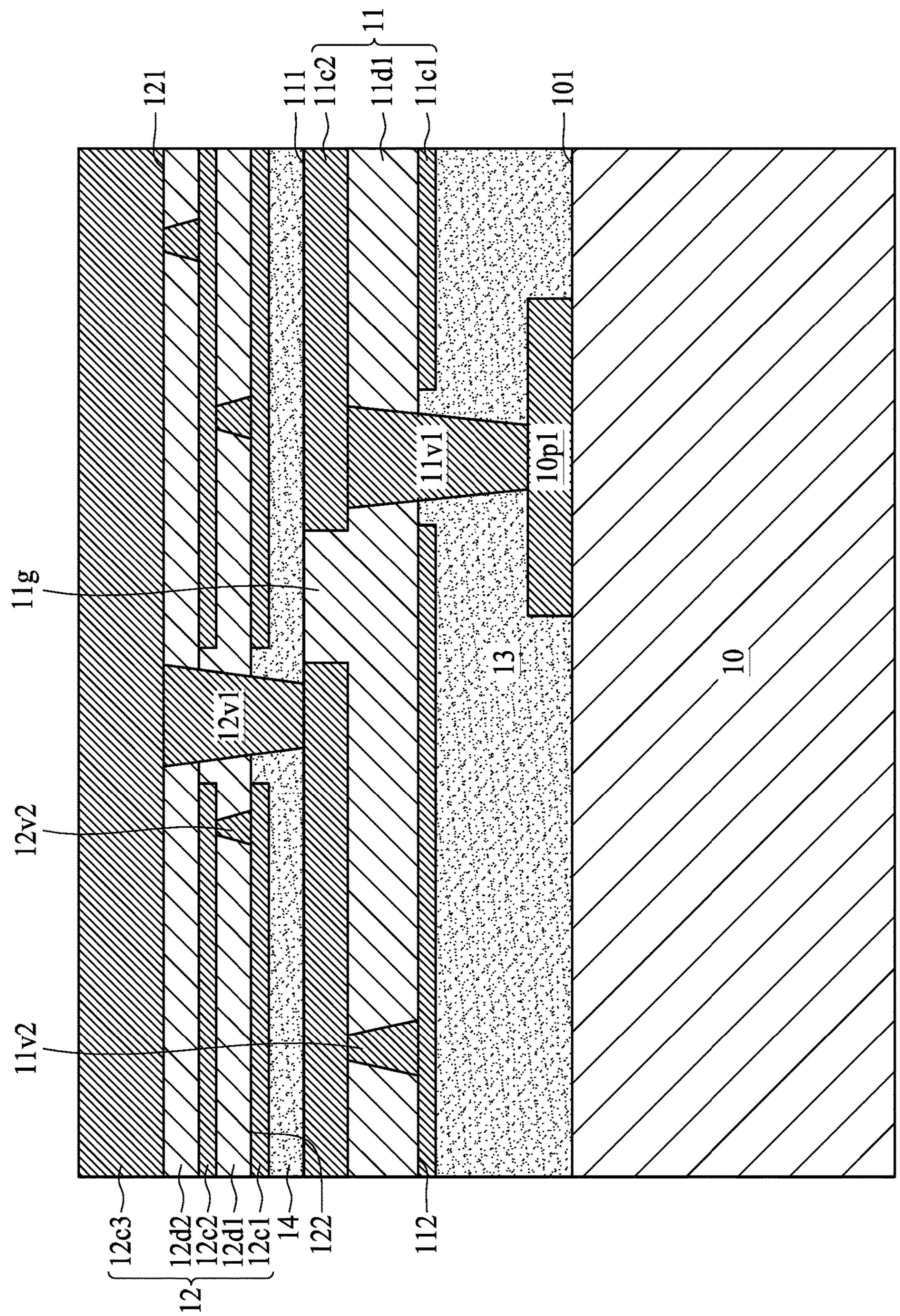
FIG. 5 illustrates an enlarged view of a portion of the semiconductor device package illustrated in FIG. 1 in accordance with some embodiments of the present disclosure.

FIG. 5 illustrates an enlarged view of a portion (e.g., the portion encircled by a dotted-line square A) of the semiconductor device package 1 in FIG. 1 in accordance with some embodiments of the present disclosure. The structure illustrated in FIG. 5 is similar to the structure illustrated in FIG. 3, and the difference therebetween are described below. In some embodiments, the interconnection layer 11_c_2 has two portions separated from each other by a gap 11_g_. The through via 12_v_1 is not directly connected to through via 11_v_1 through the interconnection layer 11_c_2. For example, the through via 12_v_1 may be electrically connected to the through via 11_v_1 through the interconnection layers 11_c_1, 11_c_2, the conductive via 11_v_2 or any other conductive vias or interconnection layers within the circuit layer 11.

Referring to FIG. 1, the electronic components 15_a_ and 15_b_ are disposed on the circuit layer 12 and electrically connected to the circuit layer 10 (e.g., to the conductive pads 12_c_ exposed from the solder resist 12_r_) through electrical contacts 15_ab_ and 15_bb_ (e.g., solder balls or bumps). The electronic component 15_a_ and 15_b_ may include, for example, chips or dies including semiconductor substrates. The electronic components 15_a_ and 15_b_ may include one or more integrated circuit devices and one or more overlying interconnection structures. The integrated circuit devices may include active devices such as transistors and/or passive devices such as resistors, capacitors, inductors, or a combination thereof. In some embodiments, there may be any number of electronic components depending on design specifications.

In some embodiments, the circuit layer 11 and the circuit layer 12 are configured to provide electrical connections between the electronic components 15_a_ and 15_b_ or between the electronic components 15_a_, 15_b_ and the substrate 10. In some embodiments, the circuit layer 11 and the circuit layer 12 may provide a fan-out connection for the electronic components 15_a_ and 15_b_.

In some embodiments, there is only one circuit layer connected to the substrate, and a through via penetrates the circuit layer to provide an electrical connection between the circuit layer and the substrate. To achieve a better electrical performance (e.g., a lower insertion loss), the circuit layer may have a thickness greater than 50 μm. Therefore, the through via having a relatively great height is specified. However, due to the process limitation, it is difficult to form a through via having an aspect ratio greater than less than 1:5. Hence, to form the through via having a relatively greater height, the width (or diameter) of the through via should be increased as well, which would increase the area of the semiconductor device package and hinder the miniaturization of the semiconductor device package.

In accordance with the embodiments of FIGS. 1, 2, 3, 4 and 5, since the semiconductor device package 1 includes two circuit layers (e.g., the circuit layers 11, 12) connected to each other, and each of the circuit layers 11 and 12 can has a relatively thinner thickness (e.g., less than 50 μm) to achieve the same electrical performance. Thus, the through vias 11_v_1 and 12_v_1 can have a relatively shorter height, which would simplify the manufacturing process. In addition, the width (or diameter) of the through vias 11_v_1 and 12_v_1 can be reduced as well. In some embodiments, the semiconductor device package 1 may include any number of circuit layers in a stacked arrangement similar to the arrangement of the circuit layers 11 and 12 depending on different design specifications.

FIG. 6A, FIG. 6B, FIG. 6C, FIG. 6D, FIG. 6E, FIG. 6F, FIG. 6G and FIG. 6H illustrate a method for manufacturing a semiconductor device package in accordance with some embodiments of the present disclosure. In some embodiments, the method illustrated in FIG. 6A, FIG. 6B, FIG. 6C, FIG. 6D, FIG. 6E, FIG. 6F, FIG. 6G and FIG. 6H are used to manufacture the semiconductor device package 1 as shown in FIG. 1. Alternatively, the method illustrated in FIG. 6A, FIG. 6B, FIG. 6C, FIG. 6D, FIG. 6E, FIG. 6F, FIG. 6G and FIG. 6H can be used to manufacture other semiconductor device packages.

Figure 6A:
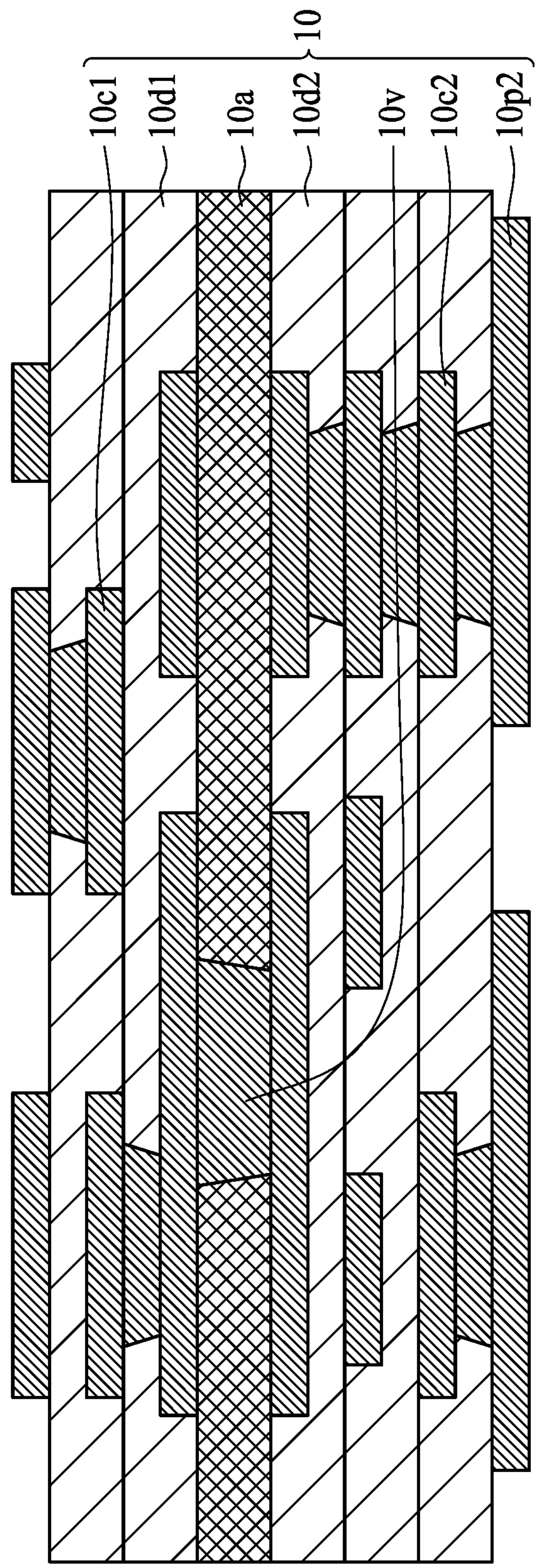
FIG. 6A, FIG. 6B, FIG. 6C, FIG. 6D, FIG. 6E, FIG. 6F, FIG. 6G and FIG. 6H illustrate one or more stages of an example of a method for manufacturing a semiconductor device package in accordance with some embodiments of the present disclosure.

Referring to FIG. 6A, a substrate 10 is provided. The substrate 10 may be a multi-layer substrate which includes a core layer and a conductive material and/or structure. For example, the substrate 10 includes a core portion 10*a*, and may be in a wafer type, a panel type or a strip type. The substrate 10 includes at least one dielectric layer (including, for example, the dielectric layers 10*d*1 and 10*d*2) and at least one conductive layer (including, for example, the conductive layers 10*c*1 and 10*c*2) in contact with the dielectric layer. The dielectric layer and the conductive layer are disposed on the surfaces 101 and 102 of the substrate 10. The substrate 10 has one or more conductive vias 10*v* penetrating the core portion 10*a* and electrically connecting the conductive layer disposed on the surface 101 of the substrate 10 with the conductive layer disposed on the surface 102 of the substrate 10.

Figure 6B:
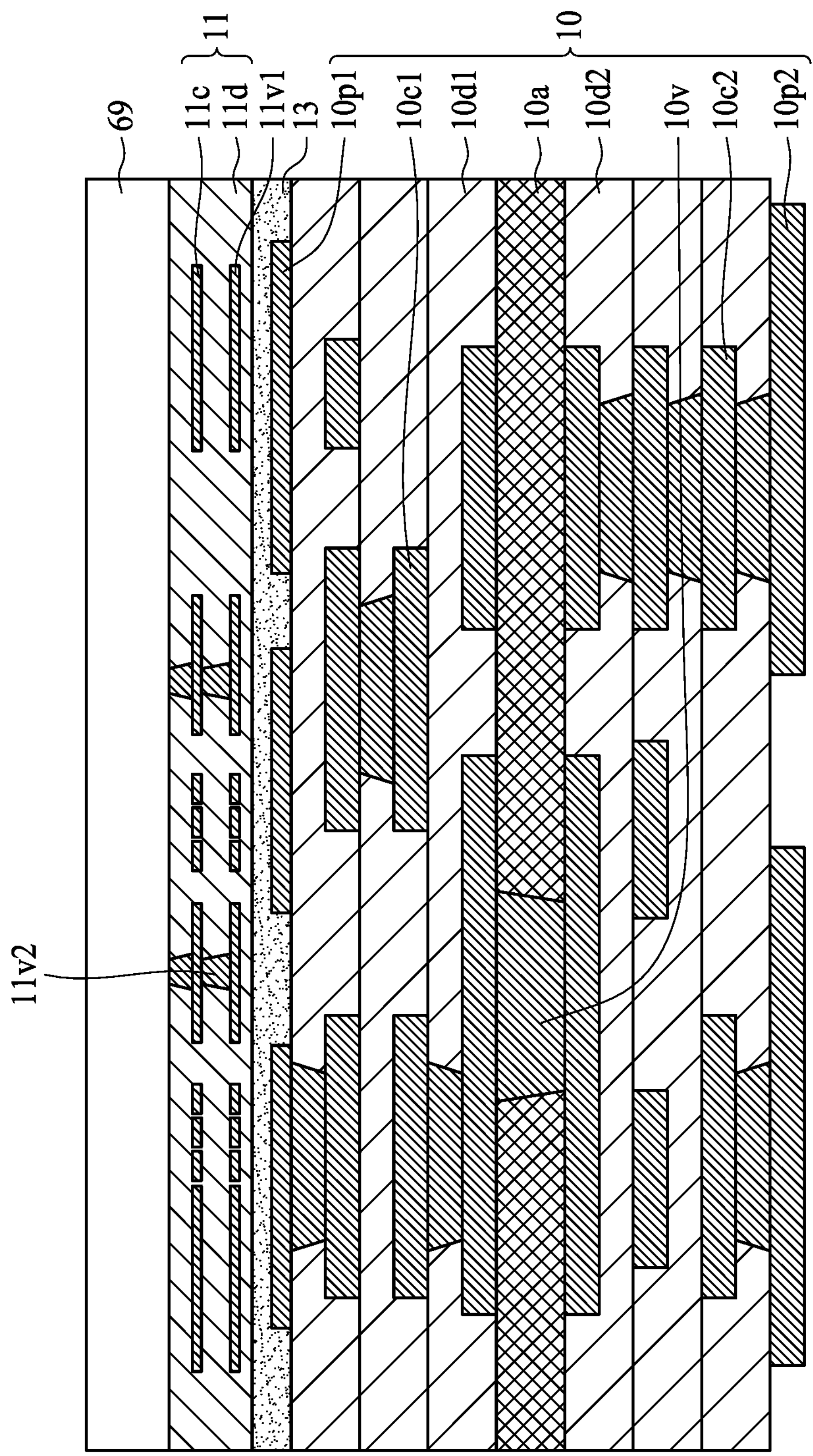

Referring to FIG. 6B, an adhesive layer 13 is formed or applied on the surface 101 of the substrate 10. A circuit layer 11 disposed on a carrier 69 is provided. The carrier 69 may be a glass carrier, and may be in a wafer type, a panel type or a strip type. The circuit layer 11 is attached to the substrate 10 through the adhesive layer 13. In some embodiments, the adhesive layer 13 is then cured. In some embodiment, the circuit layer 11 may be pressed to the substrate 10. Thus, the thickness of the adhesive layer 13 is determined by the gap between the circuit layer 11 and the substrate 10. In some embodiments, the bottommost interconnection layer of the circuit layer 11 and the uppermost conductive layer (e.g., the conductive pads 10*p*1) of the substrate 10 may be embedded in the adhesive layer 13.

Figure 6C:
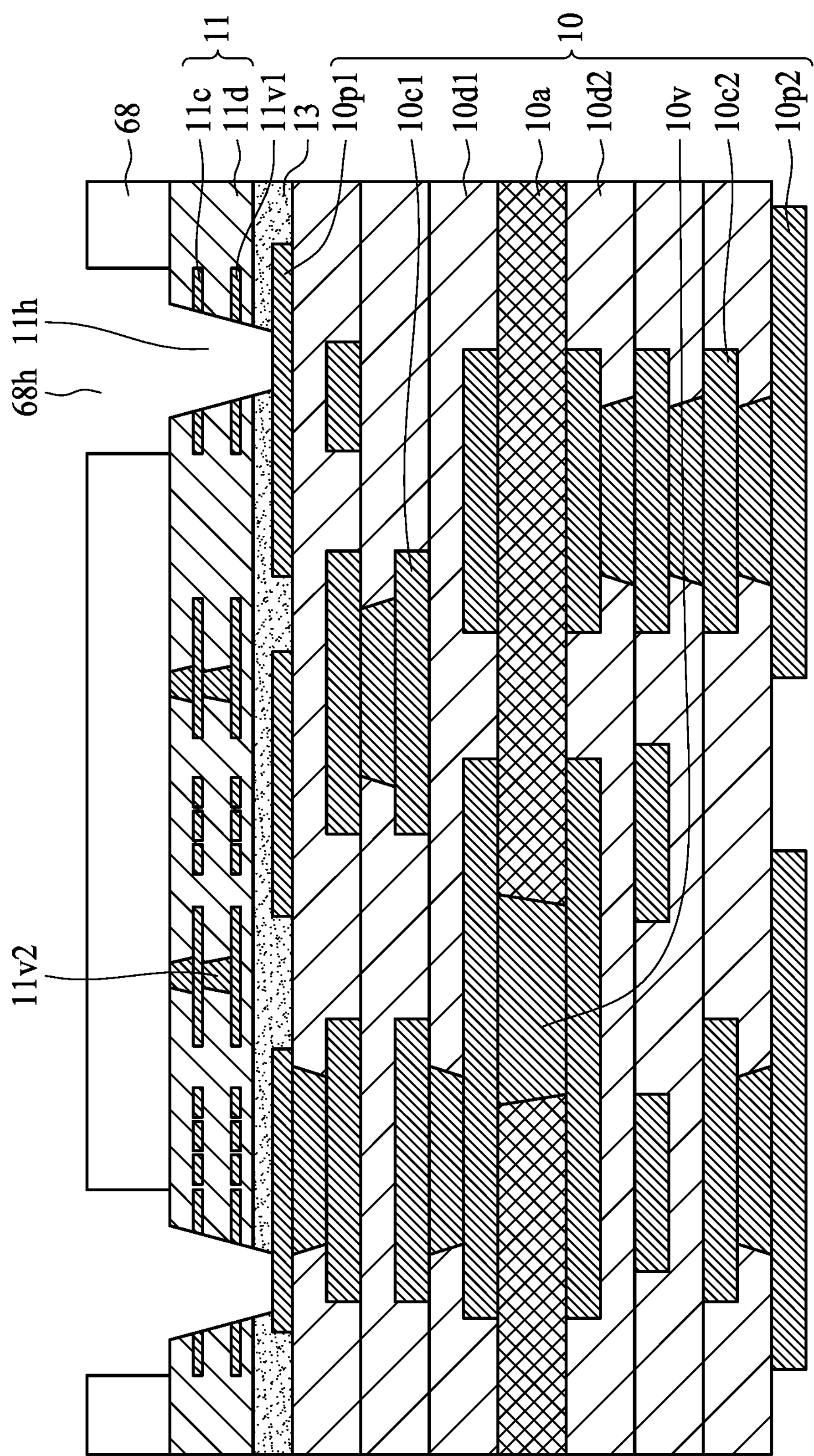

Referring to FIG. 6C, the carrier 69 is removed from the circuit layer 11 to expose a top portion of the circuit layer 11. A photoresist layer 68 is formed or disposed on the circuit layer 11. Then, the photoresist layer 68 is patterned to from one or more openings 68*h* to expose a portion of the circuit layer 11. Through holes 11*h* are then formed at the positions corresponding to the openings 68*h* of the photoresist layer 68. The though holes 11*h* are formed to penetrate the circuit layer 11 and the adhesive layer 13 to expose the conductive pads 10*c*1 disposed on the surface 101 of the substrate 10. In some embodiments, a width of the openings 68*h* is greater than a width of the through holes 11*h*.

Figure 6D:
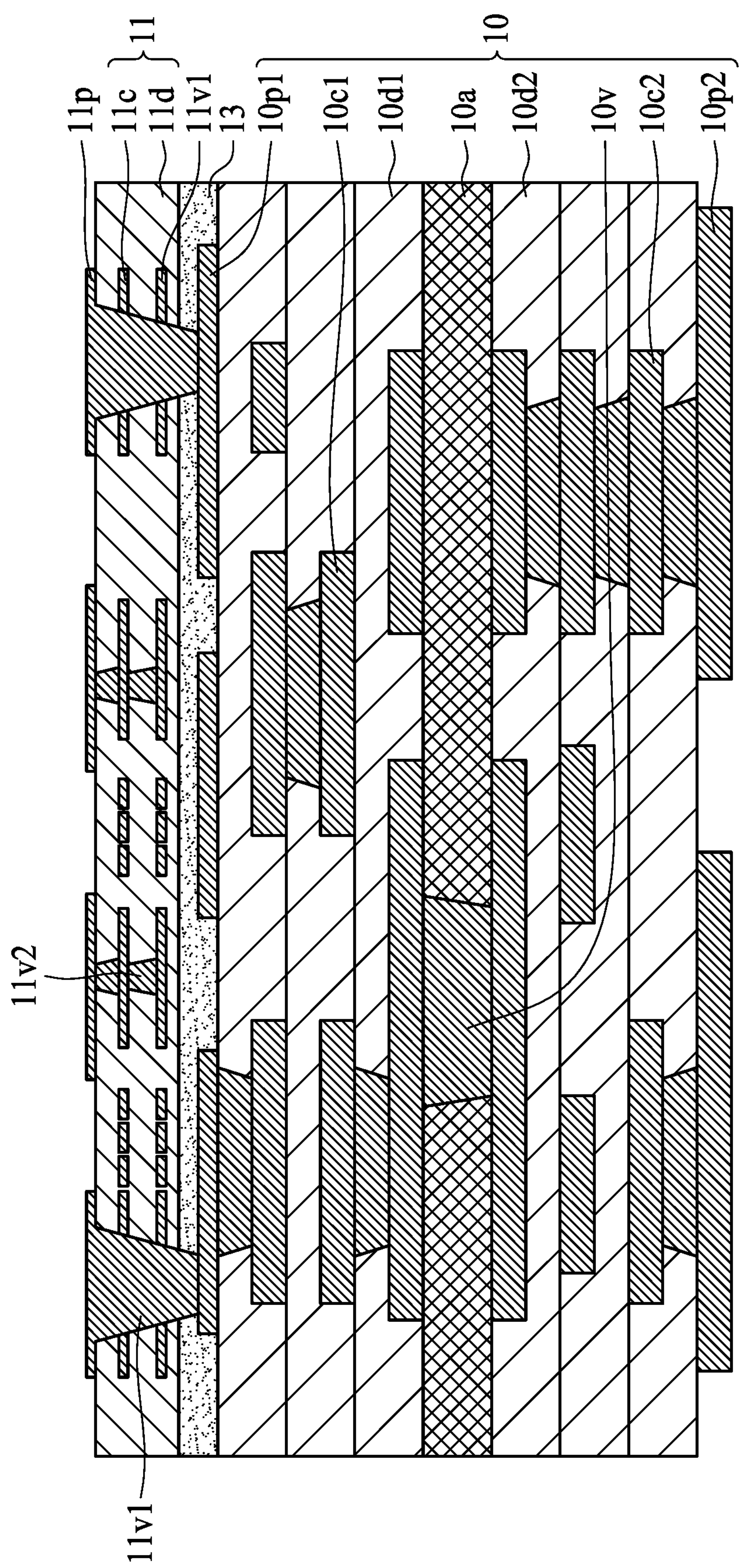

Referring to FIG. 6D, a metal layer is formed on the surface 111 of the circuit layer 11 and within the through holes 11*h* to form the conductive pads 11*p* and the through via 11*v*1. In some embodiments, the metal layer may be formed by, for example, plating or any other suitable techniques.

Figure 6E:
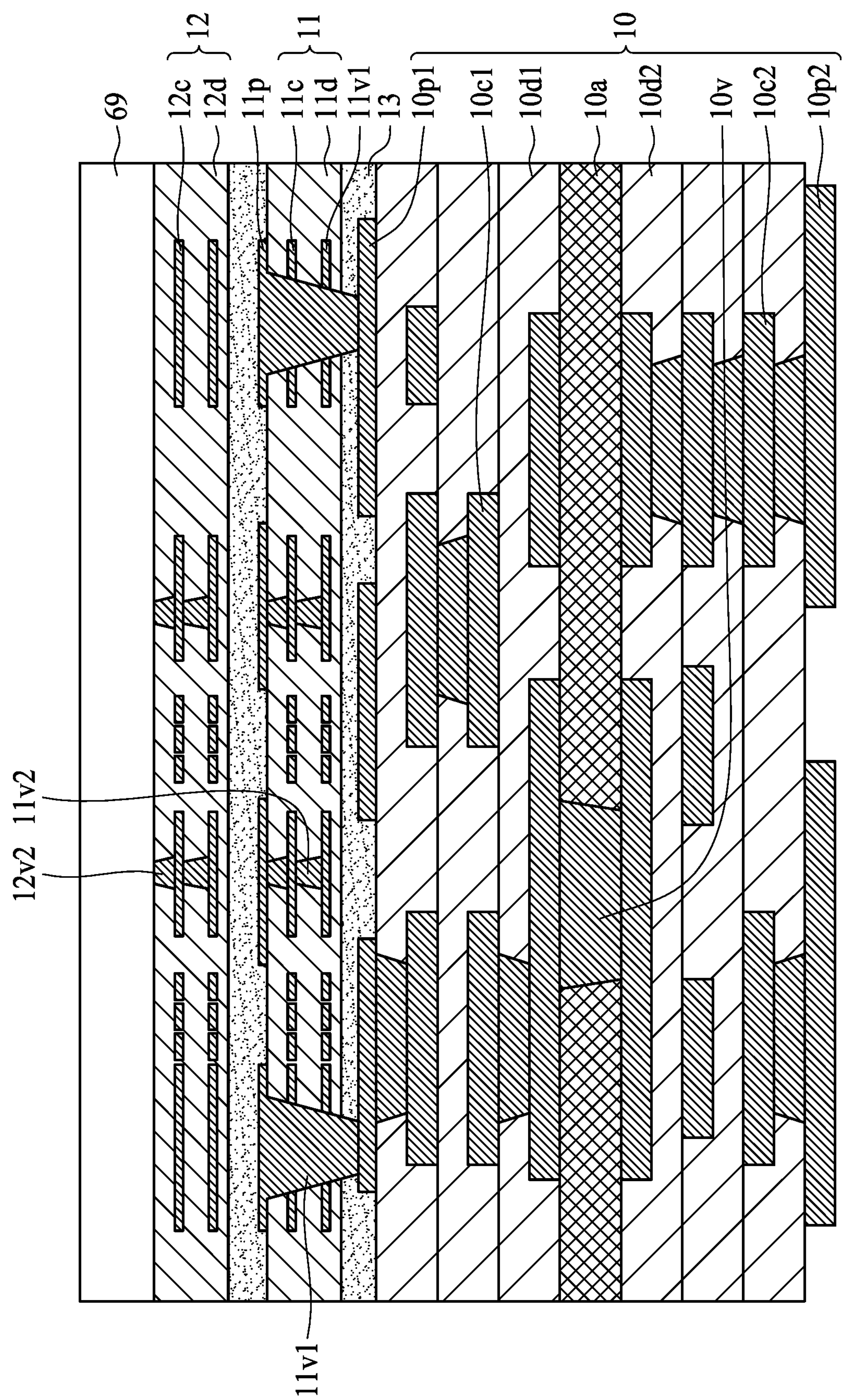

Referring to FIG. 6E, an adhesive layer 14 is formed or applied on the surface 111 of the circuit layer 11. A circuit layer 12 disposed on a carrier 69 is provided. The carrier 69 may be a glass carrier, and may be in a wafer type, a panel type or a strip type. The circuit layer 12 is attached to the circuit layer 11 through the adhesive layer 14. In some embodiments, the adhesive layer 14 is then cured. In some embodiment, the circuit layer 12 may be pressed to the circuit layer 11. Thus, the thickness of the adhesive layer 14 is determined by the gap between the circuit layer 11 and the circuit layer 12. In some embodiments, the bottommost interconnection layer of the circuit layer 12 and the uppermost conductive layer (e.g., the conductive pads 11*p*) of the circuit layer 11 may be embedded in the adhesive layer 14.

Figure 6F:
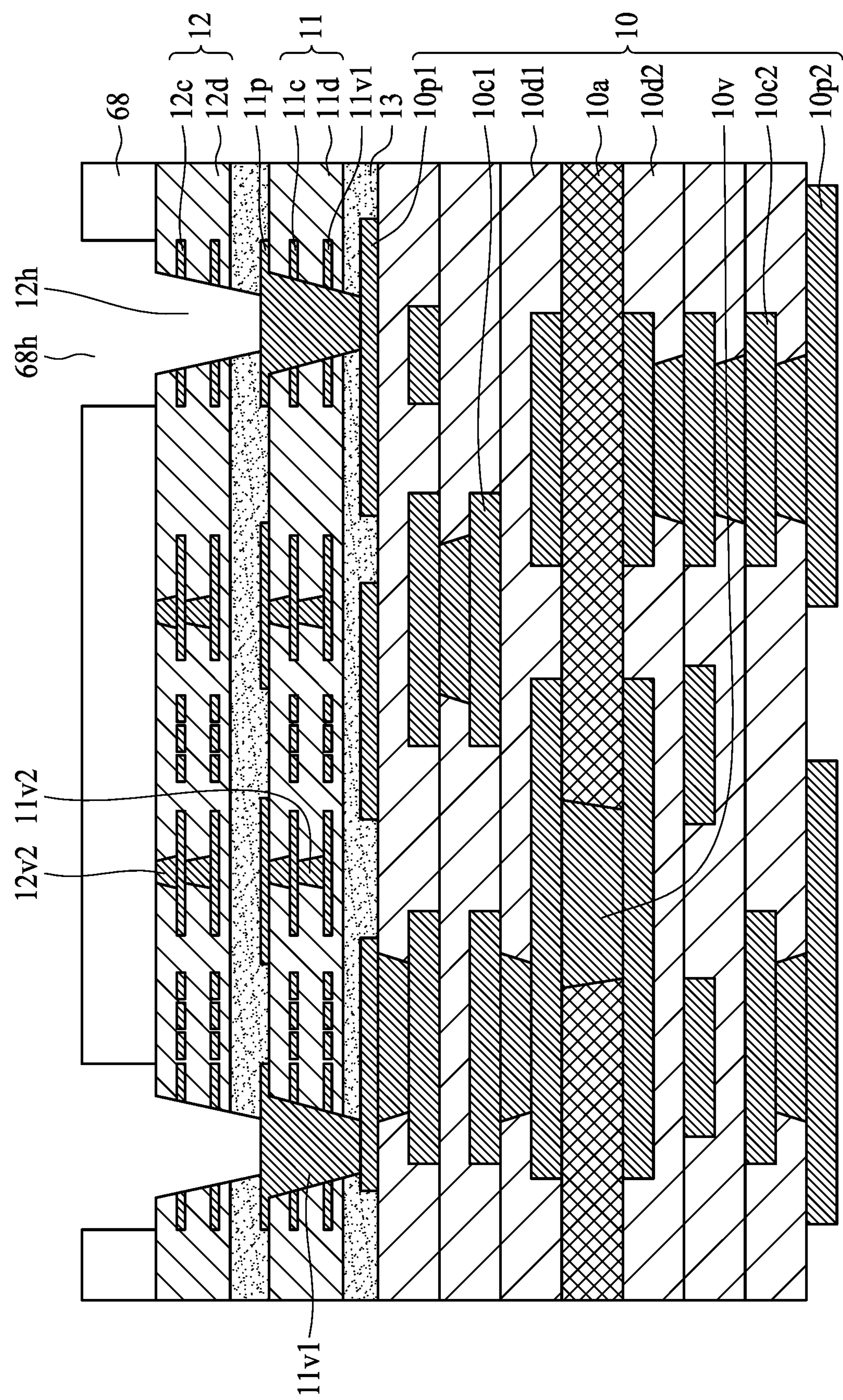

Referring to FIG. 6F, the carrier 69 is removed from the circuit layer 12 to expose a top portion of the circuit layer 12. A photoresist layer 68 is formed or disposed on the circuit layer 12. Then, the photoresist layer 68 is patterned to from one or more openings 68*h* to expose a portion of the circuit layer 12. Through holes 12*h* are then formed at the positions corresponding to the openings 68*h* of the photoresist layer 68. The though holes 12*h* are formed to penetrate the circuit layer 12 and the adhesive layer 14 to expose the conductive pads 11*p* and/or the through via 11*v*1. In some embodiments, a width of the openings 68*h* is greater than a width of the through holes 12*h*.

Figure 6G:
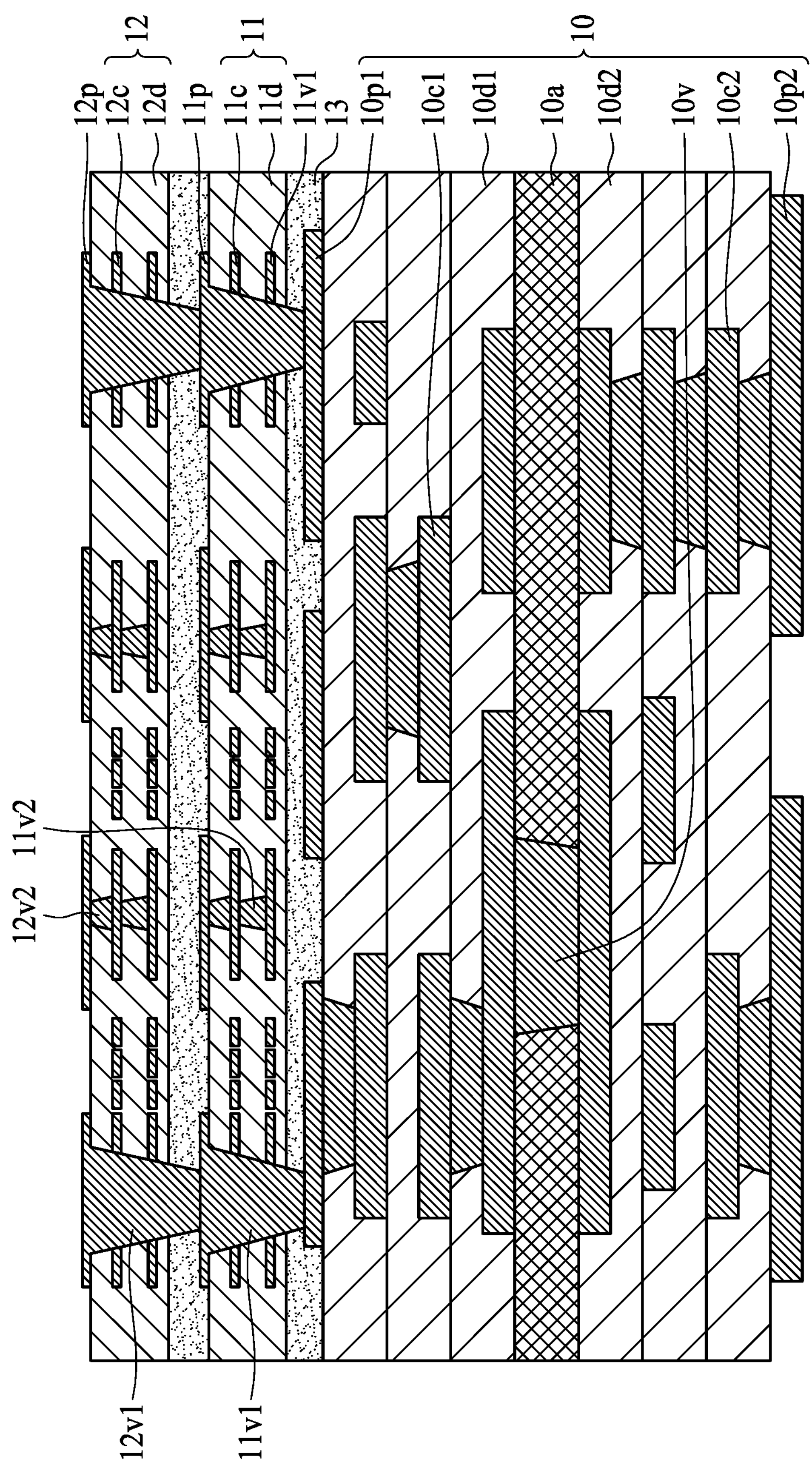

Referring to FIG. 6G, a metal layer is formed on the surface 121 of the circuit layer 12 and within the through holes 12*h* to form the conductive pads 12*p* and the through via 12*v*1. In some embodiments, the metal layer may be formed by, for example, plating or any other suitable techniques.

Figure 6H:
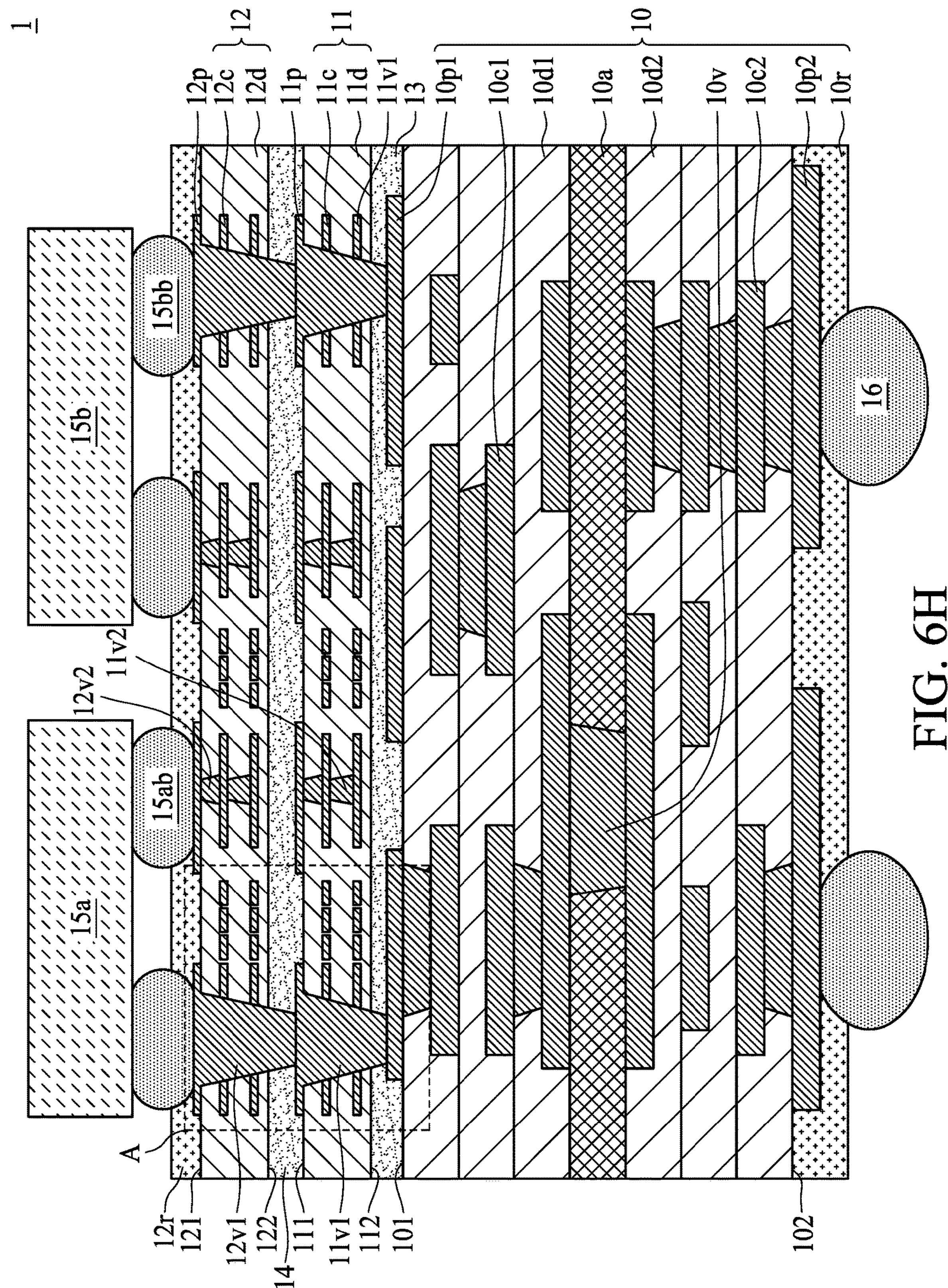

Referring to FIG. 6H, electronic components 15*a* and 15*b* are disposed on the surface 121 of the circuit layer 12. For example, the electronic components 15*a* and 15*b* are connected to the conducive pads 12*p* through electrical contacts 15*ab*, 15*bb* (e.g., solder balls or bump). Electrical contacts 16 (e.g., solder balls) are then connected to the conductive pads 10*p*2 of the substrate 10 exposed from the solder resist 10*r*.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:

a substrate;

a first redistribution layer (RDL) disposed on the substrate, the first RDL having a plurality of dielectric layers and a first through via penetrating the first RDL from an upper surface to a lower surface of the first RDL, wherein the first RDL comprises a first conductive via penetrating one of the dielectric layers, wherein the first through via tapers in a direction from the first RDL toward the substrate, and wherein the first conductive via tapers in a direction from the substrate toward the first RDL;

a second RDL disposed on the first RDL, the second RDL having a plurality of dielectric layers and a second through via penetrating the second RDL from an upper surface to a lower surface of the second RDL, wherein the second RDL comprises a second conductive via penetrating one of the dielectric layers, wherein the second through via tapers in a direction from the second RDL toward the substrate, and wherein the second conductive via tapers in a direction from the substrate toward the second RDL; and wherein an aspect ratio of the first through via is equal to or less than 1:2, and wherein an aspect ratio of the second through via is equal to or less than 1:2.

2. The semiconductor device package of claim 1, wherein a width of a top surface of the first through via is greater than a width of a bottom surface of the second through via.

3. The semiconductor device package of claim 1, wherein the substrate has one or more interconnection layers, the first RDL has one or more interconnection layers at least partially covered by the dielectric layers, and a line/space (L/S) of the interconnection layers of the substrate is greater than a L/S of the interconnection layers of the first RDL.

4. The semiconductor device package of claim 2, wherein the first conductive via electrically connecting one of the interconnection layers to an adjacent interconnection layer.

5. The semiconductor device package of claim 1, further comprising a first connection layer disposed between the first RDL and the second RDL, wherein the first through via penetrates the first connection layer and contacting the substrate.

6. The semiconductor device package of claim 1, further comprising a second connection layer disposed between the first RDL and the second RDL, wherein the second through via penetrates the second connection layer and electrically connected to the first RDL.

7. The semiconductor device package of claim 1, wherein the second through via is substantially aligned with the first through via in a direction perpendicular to a surface of the substrate on which the first RDL is disposed.

8. The semiconductor device package of claim 1, wherein the second through via is misaligned with the first through via in a direction perpendicular to a surface of the substrate on which the first RDL is disposed.

9. The semiconductor device package of claim 1, further comprising an electronic component disposed on the second RDL and electrically connected to the substrate through the first RDL and the second RDL.

10. A semiconductor device package, comprising:

a lower-density substrate; and a first higher-density substrate disposed on the lower-density substrate, the first higher-density substrate having a plurality of dielectric layers and a plurality of interconnection layers at least partially covered by the dielectric layers, the first higher-density substrate including a first through via penetrating the dielectric layers and electrically connecting the first higher-density substrate with the lower-density substrate, wherein an aspect ratio of the first through via is in a range from 1:1 to 1:2.

11. The semiconductor device package of claim 10, further comprising a first adhesive layer disposed between the lower-density substrate and the first higher-density substrate, wherein the first through via penetrates the first adhesive layer and electrically connected to the first higher-density substrate and the lower-density substrate.

12. The semiconductor device package of claim 10, wherein the first higher-density substrate has a first conductive via penetrating one of the dielectric layers and electrically connecting one of the interconnection layers to an adjacent interconnection layer.

13. The semiconductor device package of claim 12, wherein the first conductive via tapers in a direction from the lower-density substrate toward the first higher-density substrate.

14. The semiconductor device package of claim 10, wherein the first through via tapers in a direction from the first higher-density substrate toward the lower-density substrate.

15. The semiconductor device package of claim 10, further comprising:

a second adhesive layer disposed on the first higher-density substrate; and a second higher-density substrate disposed on the second adhesive layer and electrically connected to the first higher-density substrate.

16. A method of manufacturing a semiconductor device package, comprising:

(a) providing a substrate;

(b) connecting a first circuit layer to the substrate through a first adhesive layer, the first circuit layer having a plurality of dielectric layers;

(c) forming a first through via penetrating the dielectric layers of the first circuit layer and the first adhesive layer to be electrically connected to the substrate, wherein a width of the first through via to a height of the first through via is equal to or less than 1:2; and (d) connecting a second circuit layer to the first circuit layer through a second adhesive layer, the second circuit layer having a plurality of dielectric layers.

17. The method of claim 16, further comprising:

(e) forming a second through via penetrating the dielectric layers of the second circuit layer and the second adhesive layer to be electrically connected to the first circuit layer.

18. The method of claim 17, wherein the second through via is substantially aligned with the first through via in a direction perpendicular to a surface of the substrate on which the first circuit layer is disposed.

19. The semiconductor device package of claim 9, wherein the electronic component electrically connected to the first RDL and the second RDL through an electrical contact.

20. The semiconductor device package of claim 1, wherein the second through via contacts a top surface of the first through via.

21. The semiconductor device package of claim 1, wherein the substrate is a core substrate.

22. The semiconductor device package of claim 15, wherein the second higher-density substrate comprises a second through via penetrating the second higher-density substrate and electrically connecting the second higher-density substrate with the first higher-density substrate, and wherein the second through via is misaligned with the first through via in a direction perpendicular to a surface of the lower-density substrate on which the first higher-density layer is disposed.

* * * * *